(12) United States Patent
Kiyose

(10) Patent No.: US 6,515,520 B2
(45) Date of Patent: Feb. 4, 2003

(54) CHARGE PUMP CIRCUIT FOR PHASE-LOCKED LOOP CIRCUITRY

(75) Inventor: Masashi Kiyose, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 107 days.

(21) Appl. No.: 09/783,631

(22) Filed: Feb. 14, 2001

(65) Prior Publication Data

US 2002/0041215 A1 Apr. 11, 2002

Related U.S. Application Data

(62) Division of application No. 09/465,958, filed on Dec. 17, 1999, now Pat. No. 6,222,421.

(30) Foreign Application Priority Data

Dec. 22, 1998 (JP) ............................................. 10-364239
Dec. 22, 1998 (JP) ............................................. 10-364240
Dec. 22, 1998 (JP) ............................................. 10-364241

(51) Int. Cl.$^7$ .......................... H03K 3/011; H03B 1/00; H03L 7/089
(52) U.S. Cl. .......................... 327/108; 327/111; 331/8; 331/17; 331/25; 331/10
(58) Field of Search ................................ 327/108, 111, 327/112; 331/17, 25, 8, 10, 34

(56) References Cited

U.S. PATENT DOCUMENTS 5,068,626 A * 11/1991 Takagi et al. ................. 331/17
5,362,990 A * 11/1994 Alvarez et al. ............. 327/156
5,508,660 A * 4/1996 Gersbach et al. ............. 331/17
5,532,636 A * 7/1996 Mar et al. .................... 327/157
5,646,563 A * 7/1997 Kuo ............................ 327/111
5,740,213 A   4/1998 Dreyer
6,124,741 A * 9/2000 Arcus .......................... 326/83
6,222,421 B1 * 4/2001 Kiyose ........................ 331/17

* cited by examiner

Primary Examiner—David C. Mis
(74) Attorney, Agent, or Firm—Fish & Richardson P.C.

(57) ABSTRACT

A phase-locked loop (PLL) includes a voltage controlled oscillator (VCO) and a pair of charge pump circuits (CP) and provides a stable oscillation clock signal. A phase comparator compares a reference clock signal with an oscillation clock signal generated by the VCO and generates two comparison signals. The comparison signals are input to the first CP, which generates a first CP output signal. The first CP output signal is filtered with a first low pass filter (LPF) and the filtered signal (control voltage) is provided to the VCO, which produces the oscillation clock. The second CP receives two clock signals and generates a second CP output signal. The second CP output signal is filtered with a second LPF and the filtered signal is converted to a digital signal with an A/D converter. The digital signal is applied to a bias circuit, which then produces first and second control voltages. These control voltages are then applied to the first and second CPs to control the charging and discharging currents of the CPs.

6 Claims, 10 Drawing Sheets

Output Terminal Voltage

Output Terminal Voltage

Output Terminal Voltage

CHARGE PUMP CIRCUIT FOR PHASE-LOCKED LOOP CIRCUITRY

This is a divisional of U.S. patent application Ser. No. 09/465,958, filed Dec. 17, 1999, now U.S. Pat. No. 6,222,421 and incorporated herein by reference.

BACKGROUND OF THE INVENTION

The present invention relates to a phase-locked loop, and more particularly, to frequency stabilization of an oscillation output signal generated by a phase-locked loop. The present invention further relates to a current drive type charge pump circuit and a voltage-controlled oscillator of the phase-locked loop.

FIG. 1 is a schematic block diagram showing a conventional phase-locked loop (PLL) 100. FIG. 2 is a timing chart illustrating the operation of a phase comparator 1 of the PLL 100.

The PLL 100 includes the phase comparator 1, a charge pump circuit 2, a low-pass filter (LPF) 3, and a voltage-controlled oscillator (VCO) 4. The phase comparator 1 compares the phase of a reference clock signal RK with the phase of an oscillation clock signal CK, which is generated by the VCO 4, and generates comparison output signals PP, PN in accordance with the phase difference between the reference clock signal RK and the oscillation clock signal CK. For example, as shown in FIG. 2, when the phase of the reference clock signal RK is ahead of the phase of the oscillation clock signal CK, the comparison output signal PN goes high. On the other hand, when the phase of the reference clock signal RK is behind or delayed from that of the oscillation clock signal CK, the comparison output signal PP goes low.

The charge pump circuit 2 has transistors, which are activated and deactivated in response to the comparison output signals PP, PN, and sends a charge pump output signal PD, which corresponds to the comparison output signals PP, PN, to the LPF 3. For example, the charge pump output signal PD is lowered to the ground voltage when the comparison output signal PN goes high and raised to the power supply voltage when the comparison output signal PP goes low. When the comparison output signal PP is high and the comparison output signal PN is low, all of the transistors are deactivated and the output terminal of the charge pump circuit 2 enters a high impedance state.

The LPF 3 removes the alternating current components from the charge pump output signal PD and provides a control voltage Vc to the VCO 4. The control voltage Vc fluctuates in accordance with the pulse width of the output signal PD. Accordingly, the control voltage Vc decreases when the charge pump output signal PD becomes equal to the ground voltage and increases when the charge pump output signal PD becomes equal to the power supply voltage.

The VCO 4 is provided with, for example, a ring oscillator and alters the frequency of the oscillation clock signal CK by increasing or decreasing the delay amount of the feedback loop in response to the control voltage Vc.

In the LPF 3, when the phase of the reference clock signal RK is offset from that of the oscillation clock signal CK, the oscillation frequency of the VCO 14 is controlled in a direction opposite the offset direction. In this manner, the oscillation clock signal CK is synchronized with the reference clock signal RK.

In the charge pump circuit 2, it is desirable that the current flowing out through the output terminal in response to a low comparison output signal PP be substantially equal to the current flowing in through the output terminal in response to a high comparison output signal PN. When the current flowing in through the output terminal becomes unequal to the current flowing out through the output terminal, the phase difference between the reference clock signal RK and the oscillation clock signal CK becomes biased and hinders stable operation of the LPF 3. As a result, external noise may destabilize the operation of the LPF 3. Furthermore, the phase lock may be released.

A current drive type charge pump circuit is one type of a charge pump circuit used for an LPF. A current drive type charge pump circuit is provided with a CMOS transistor, which has a current capacitance that is sufficient for driving a load capacitor connected to the output terminal and which charges and discharges the load capacitor in response to an input signal. In this type of charge pump circuit, it is desirable that the current flowing out to the load during charging be substantially equal to the current flowing in from the load during discharging. Accordingly, it is preferable that a CMOS transistor having substantially identical p-channel and n-channel transistor operational characteristics be used.

FIG. 3 is a schematic circuit diagram illustrating a current drive type charge pump circuit 200, and FIG. 4 is a graph illustrating the operational characteristics of a CMOS transistor employed in the charge pump circuit 200.

A p-channel MOS transistor 201 and an n-channel MOS transistor 202 are connected in series between a high potential power supply and a ground. A first comparison output signal PP is applied to the gate of the transistor 201, while a second comparison output signal PN is applied to the gate of the transistor 202. A charge pump output signal PD is output from a node located between the transistors 201, 202. When the transistor 201 is activated in response to the first comparison output signal PP, a charging current Ip flows through the transistor 201 to charge the load capacitor (not shown) connected to the output terminal. When the transistor 202 is activated in response to the second comparison output signal PN, a discharging current In flows through the transistor 202 to discharge the load capacitor connected to the output terminal. A p-channel MOS transistor 203, functioning as a current control load, is connected between the transistor 201 and the high potential power supply. An n-channel MOS transistor 204 is connected between the transistor 202 and the ground. A first control voltage Vcp provided by a bias circuit 209 is applied to the gate of the transistor 203, and a second control voltage Vcn provided by the bias circuit 209 is applied to the gate of the transistor 204.

The bias circuit 209 includes a resistor 205 and transistors 206–208. The resistor 205 and the n-channel MOS transistor 206 are connected in series between the high potential power supply and the ground. A node A located between the resistor 205 and the transistor 206 is connected to the gate of the transistor 206. The p-channel MOS transistor 207 and the n-channel MOS transistor 208 are connected in series between the high potential power supply and the ground. A node B located between the transistors 207, 208 is connected to the gate of the transistor 207. The gate of the transistor 208 is connected to the node A. The transistors 207, 208 form a current mirror circuit relative to the resistor 205 and the transistor 206. The second control voltage Vcn applied to the n-channel transistor 204 is provided from the node A, and the first control voltage Vcp applied to the p-channel transistor 203 is provided from the node B. The current mirror operation of the bias circuit 209 optimally maintains the currents Ip, In flowing through the corresponding transistors 201, 202 at a constant value.

Even if the voltage applied to the gates of the transistors 201, 202 are constant, the currents Ip, In fluctuate in accordance with the voltage at the output terminal. Current does not flow unless there is a voltage difference between the source and the drain even if voltage is applied to the gate. Thus, the currents Ip, In do not flow when the transistor 201 is activated with the load capacitor in a charged state or when the transistor 202 is deactivated with the load capacitor in a discharged state. The fluctuation of the currents Ip, In relative to the voltage at the output terminal is shown in FIG. 4. That is, the current Ip flowing through the transistor 201 starts to increase when the voltage at the output terminal becomes lower than the power supply voltage Vdd and keeps increasing until reaching a predetermined value I0. After the current Ip reaches the predetermined value I0, the increase of the current Ip, relative to the decrease of the voltage at the output terminal, becomes gradual due to channel length modulation at the transistor 203. The current In flowing through the transistor 202 starts to increase when the voltage at the output terminal exceeds the power supply voltage Vss and keeps increasing until reaching the predetermined value I0. After the current In reaches the predetermined value I0, the increase of the current In, relative to the decrease of the voltage at the output terminal, becomes gradual due to channel length modulation at the transistor 204.

The charge pump circuit 200 selects the range of the voltage applied to the output terminal so that the currents Ip and In are included in a predetermined range. In other words, the operational characteristics of the transistors 201, 202 are set in accordance with the output terminal voltage range of the charge pump circuit 200, and the difference between the,currents Ip, In are included in the operational range of the transistors 201, 202.

The transistor 203 connected between the transistor 201 and the high power supply source decreases the source voltage of the transistor 201 from the voltage of the high potential power supply. The decrease corresponds to the voltage drop resulting from the ON resistance of the transistor 203. In the same manner, the transistor 204 connected between the transistor 202 and the ground increases the source voltage of the transistor 202 from the voltage of the ground. The increase corresponds to the voltage drop resulting from the ON resistance of the transistor 204. Accordingly, the voltage difference between the gate and source of each transistor 201, 202 during operation is decreased, and the ON/OFF response to the gate voltage is delayed. Thus, when the cycles of the comparison output signals PP, PN become short, the operation of the charge pump circuit may not be able to follow the comparison output signals PP, PN.

When the charge pump circuit 200 is an integrated circuit, it is difficult to change the operational characteristics of the integrated transistors. Thus, the operational range of the transistors are virtually fixed. However, since differences in operational characteristics occur due to differences that occur during manufacturing, the operational characteristic must be compensated for by a certain level. The compensation of the operational characteristics is especially required in a charge pump circuit having transistors that operate as a current mirror since operational differences between transistors greatly affect the circuit.

FIG. 5 is a circuit diagram illustrating a ring oscillator type VCO 300. The VCO 300 includes an odd number of CMOS inverters 301 that are connected in series. The output of the last inverter 301 is fed back to the input of the first inverter 301. An oscillation clock signal CK is output from the last inverter 301. An n-channel MOS transistor 302 is connected between each of the inverters 301 and the corresponding ground. A control voltage Vc is applied to the gate of each MOS transistor 302 to control the oscillation frequency.

When the ON resistance value of the MOS transistor 302 changes in accordance with the control voltage Vc, the amount of current flowing through each inverter 301 fluctuates. The delay amount of each inverter 301 changes in accordance with the fluctuation. Accordingly, the cycle of the oscillation clock signal CK changes in accordance with the control voltage Vc. For example, when the control voltage Vc increases, the ON resistance value of each MOS transistor 302 decreases, the current flowing through each inverter 301 increases (i.e., the delay amount of each inverter 301 decreases), and the frequency of the oscillation clock signal CK increases.

The frequency of the oscillation clock signal CK changes in proportion to the control voltage Vc. Normal oscillation operation is set in a range where the frequency of the oscillation clock signal CK can be maintained having linearity relative to the control voltage Vc. That is, as shown in FIG. 6, the frequency of the oscillation clock signal CK starts to increase when the control voltage Vc exceeds the threshold value of the MOS transistors 302 (Vl) and converges when the MOS transistors 302 are completely activated (Vh). Thus, the range of the control voltage Vc is set within a range defined between Vl and Vh in which linearity can be maintained. In this range, the frequency of the oscillation clock signal CK corresponding to the control voltage Vc changes between en fl and fh.

When using a voltage-controlled oscillator in a phase-locked loop, the number of inverters 301 and the operational characteristics of the transistors are set so that the frequency of the oscillation clock signal CK is included within a desirable band. However, differences in the operational characteristics of the transistors that occur due to manufacturing differences or temperature fluctuations in the ambient environment may cause the frequency of the clock signal CK to go out of the desirable band. A compensation circuit may be employed to maintain the frequency in the desirable range. However, since the operational characteristics of the transistors are predetermined, the compensation circuit would not be able to cope sufficiently with the manufacturing differences.

SUMMARY OF THE INVENTION

Accordingly, it is a first object of the present invention to provide a PLL that operates in a stable manner.

It is a second object of the present invention to provide a charge pump circuit that operates to follow input signals having short cycles and has a transistor operational characteristic which can be compensated for after integration.

It is a third object of the present invention to provide a voltage-controlled oscillator that can compensate for manufacturing differences after integration.

One aspect of the present invention provides a phase-locked loop including a voltage-controlled oscillator for generating an oscillation output signal having a frequency corresponding to a control voltage. A phase comparator is connected to the voltage-controlled oscillator for comparing a phase of the oscillation output signal and a phase of a reference clock signal to generate a comparison output signal. A first charge pump circuit is connected to the phase comparator for generating a first charge pump output signal in accordance with the comparison output signal. A first low-pass filter is connected to the first charge pump circuit for smoothing the first charge pump output signal and generating the control voltage. A second charge pump circuit generates a second charge pump output signal. A second low-pass filter is connected to the second charge pump circuit for smoothing the second charge pump output signal and generating a compensation voltage. A control circuit is connected to the second low-pass filter for controlling the first and second charge pump circuits to adjust the first and second charge pump output signals in accordance with the compensation voltage.

A further aspect of the present invention provides a charge pump circuit including a p-channel drive transistor and an n-channel drive transistor connected in series between a high potential power supply and a low potential power supply. Input signals are respectively applied to a gate of the p-channel drive transistor and a gate of the n-channel drive transistor in order to generate a charge pump output signal at a node between the p-channel and n-channel drive transistors. A p-channel current control transistor is connected between the p-channel drive transistor and the node. An n-channel current control transistor is connected between the n-channel drive transistor and the node. Compensation voltages are respectively applied to a gate of the p-channel current control transistor and a gate of the n-channel current control transistor.

A further aspect of the present invention provides a charge pump circuit including a p-channel drive transistor and an n-channel drive transistor connected in series between a high potential power supply and a low potential power supply. Input signal are respectively applied to a gate of the p-channel drive transistor and a gate of the n-channel drive transistor in order to generate a charge pump output signal at a node between the p-channel and n-channel drive transistors. A p-channel current control transistor is connected between the p-channel drive transistor and the node. An n-channel current control transistor is connected between the n-channel drive transistor and the node. A first transistor and a resistor are connected in series between the high potential power supply and the low potential power supply. A second transistor and a third transistor are connected in series between the high potential power supply and the low potential power supply. A fourth transistor is connected in parallel to the third transistor. A gate of the first transistor, a gate of the second transistor, and one of a gate of the p-channel current control transistor and a gate of the n-channel current control transistor are connected to a first node between the first transistor and the resistor. A gate of the third transistor and the gate of the other one of the p-channel and n-channel current control transistors are connected to a second node between the second and third transistors. A control voltage is applied to a gate of the fourth transistor.

A further aspect of the present invention provides a voltage-controlled oscillator including an oscillation circuit for generating an oscillation output signal, having a predetermined frequency, in accordance with first and second control voltages. A level shift circuit is connected to the oscillation circuit for generating the first control voltage by shifting an initial control voltage in accordance with adjustment information and providing the first control voltage to the oscillation circuit. A compensation circuit is connected to the oscillation circuit for providing the second control voltage to the oscillation circuit in accordance with changes in the operational environment. The oscillation circuit sets an oscillation frequency band of the oscillation output signal in accordance with the first control voltage.

A further aspect of the present invention provides a phase-locked loop including a voltage-controlled oscillator for generating an oscillation output signal having a frequency corresponding to a control voltage. A phase comparator is connected to the voltage-controlled oscillator for comparing a phase of the oscillation output signal and a phase of a reference clock signal to generate a comparison output signal. A first charge pump circuit is connected to the phase comparator for generating a first charge pump output signal in accordance with the comparison output signal. A first low-pass filter is connected to the first charge pump circuit for smoothing the first charge pump output signal and generating the control voltage. A second charge pump circuit generates a second charge pump output signal. A second low-pass filter is connected to the second charge pump circuit for smoothing the second charge pump output signal and generating a compensation voltage. A control circuit is connected to the second low-pass filter for controlling the first and second charge pump circuits to adjust the first and second charge pump output signals in accordance with the compensation voltage. At least one of the first and second charge pump circuits includes a p-channel drive transistor and an n-channel drive transistor connected in series between a high potential power supply and a low potential power supply. The comparison output signal is applied to a gate of the p-channel drive transistor and a gate of the n-channel drive transistor in order to output a relative charge pump output signal from a node between the p-channel and n-channel drive transistors. The at least one of the first and second charge pump circuits further includes a p-channel current control transistor connected between the p-channel drive transistor and the node, and an n-channel current control transistor connected between the n-channel drive transistor and the node. An adjustment voltage is applied to a gate of the p-channel current control transistor and a gate of the n-channel current control transistor. The voltage-controlled oscillator includes an oscillation circuit for generating the oscillation output signal in accordance with the control voltage. The control voltage includes a first control voltage and a second control voltage. The oscillation circuit sets an oscillation frequency band of the oscillation output signal in accordance with the first control voltage. The voltage-controlled oscillator further includes a level shift circuit connected to the oscillation circuit for generating the first control voltage by shifting an initial control voltage in accordance with adjustment information and providing the first control voltage to the oscillation circuit, and a compensation circuit connected to the oscillation circuit for adjusting the second control voltage in accordance with changes in the operational environment.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
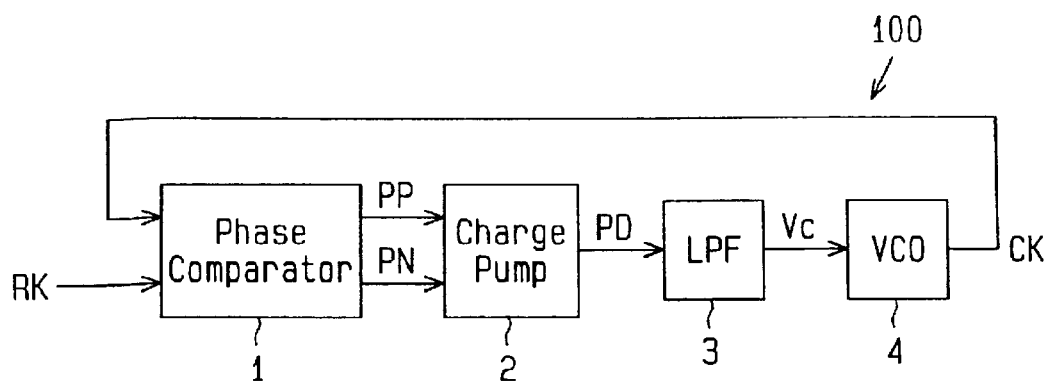
FIG. 1 is a schematic block diagram showing a prior art phase-locked loop.
Figure 2:
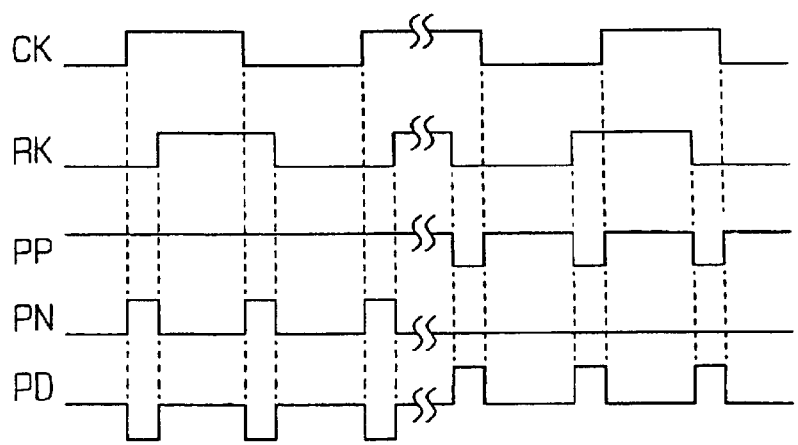
FIG. 2 is a timing chart showing the operation of the phase-locked loop of FIG. 1.
Figure 3:
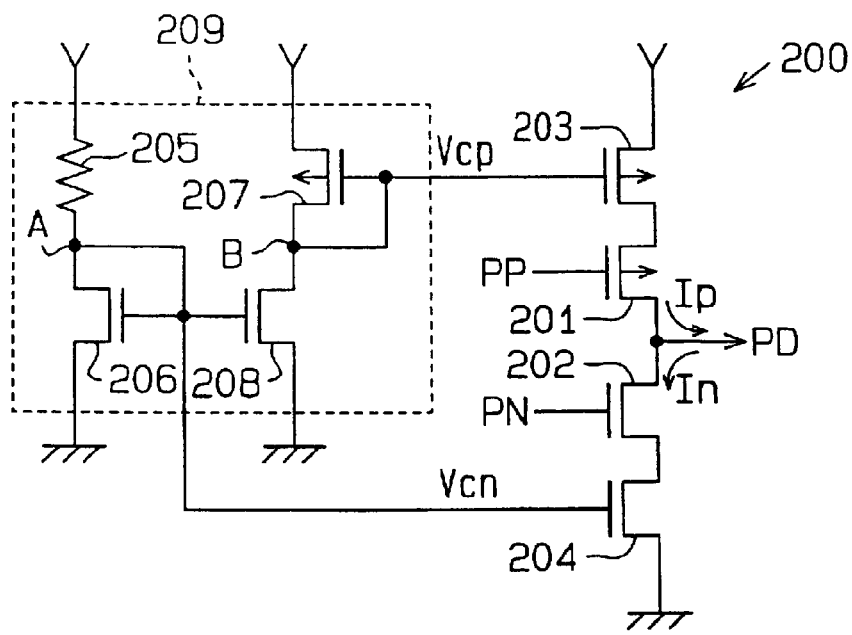
FIG. 3 is a circuit diagram showing a prior art charge pump circuit.
Figure 4:
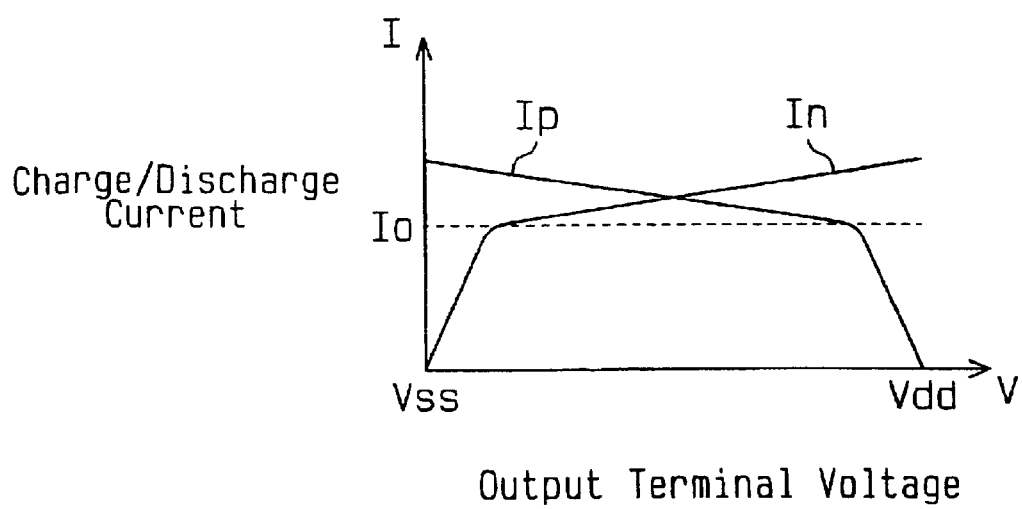
FIG. 4 is a graph showing the relationship between the voltage at an output terminal and the charge and discharge currents in the charge pump circuit of FIG. 3.
Figure 5:
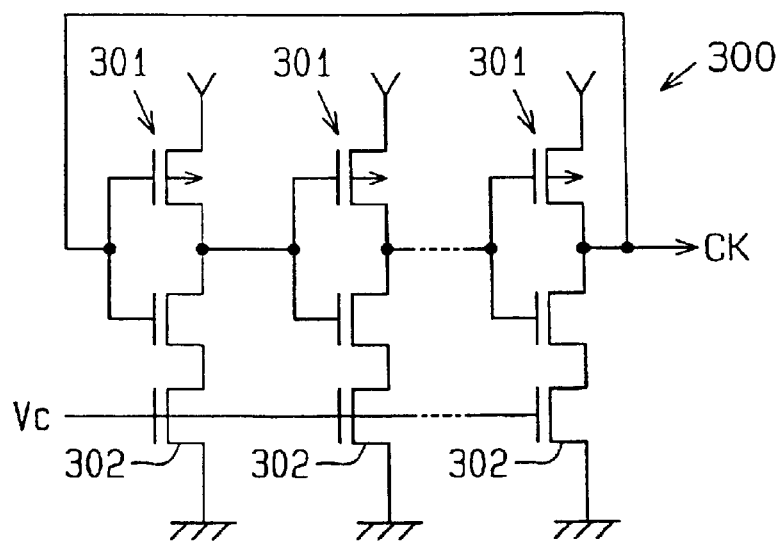
FIG. 5 is a circuit diagram showing a prior art voltage-controlled oscillator.

In the drawings, like numerals are used for like elements throughout.

First Embodiment

Figure 7:
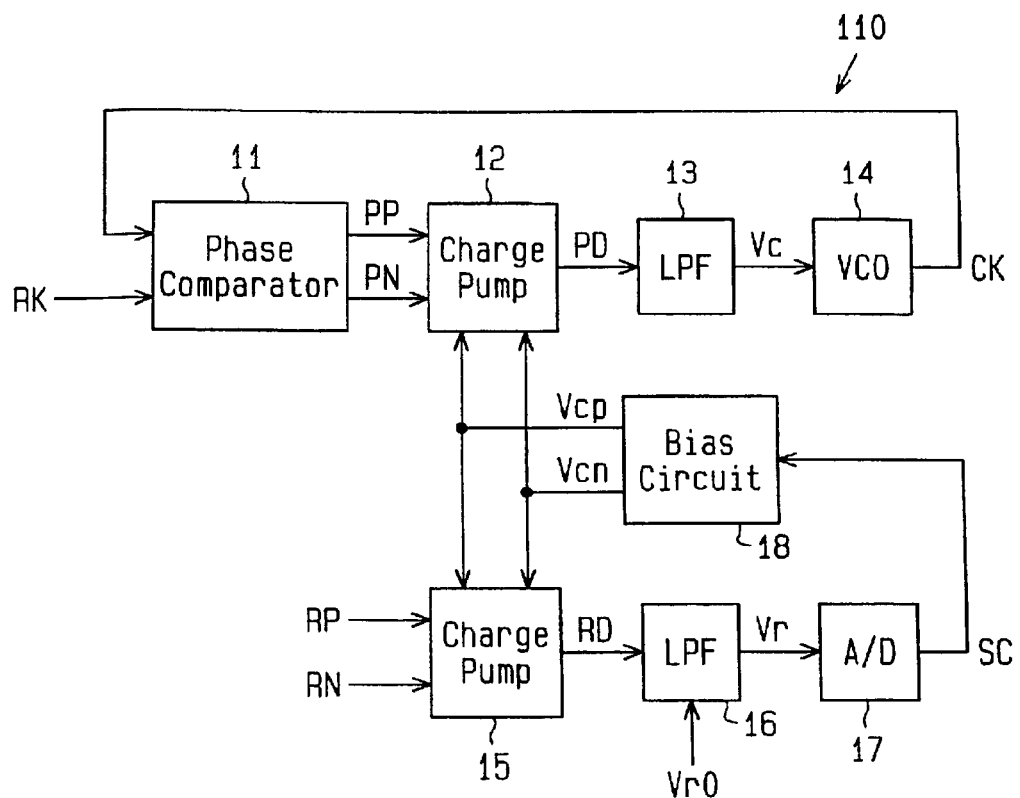
FIG. 7 is a schematic block diagram showing a phase-locked loop according to a first embodiment of the present invention.

FIG. 7 is a schematic block diagram showing a PLL 110 according to a first embodiment of the present invention. The PLL 110 includes a phase comparator 11, a first charge pump circuit 12, a second charge pump circuit 15, a first low-pass filter (LPF) 13, a second low-pass filter (LPF) 16, a voltage-controlled oscillator 14, an A/D converter 17, and a bias circuit 18.

The phase comparator 11 compares the phase of a reference clock signal RK with the phase of an oscillation clock signal CK, generated by the voltage-controlled oscillator 14, and sends comparison output signals PP, PN, in accordance with the phase difference between the reference clock signal RK and the oscillation clock signal CK, to the first charge pump circuit 12. In the phase comparator 11, the reference clock signal RK and the oscillation clock signal CK are synchronized when the phase difference between the two clock signals is constant.

The first charge pump circuit 12 sends a first charge pump output signal PD to the LPF 13 in response to the comparison output signals PP, PN. More specifically, the first charge pump circuit 12 includes first transistors activated and deactivated in response to the comparison output signals PP, PN and second transistors for controlling the current flowing through the first transistor in accordance with first and second control voltages Vcp, Vcn received from a bias circuit 18.

The first LPF 13 removes alternating current components from the first charge pump output signal PD and provides a control voltage Vc to the VCO 14.

The VCO 14 is formed by, for example, a ring oscillator and adjusts the frequency of the oscillation clock signal CK in accordance with the control voltage Vc. The processes performed between the phase comparator 11 and the VCO 14 are the same as those performed by the prior art phase-locked loop 100 shown in FIG. 1.

The second charge pump circuit 15 preferably has a configuration that is the same as that of the first charge pump circuit 12 and sends a second charge pump output signal RD to the second LPF 16 in response to clock signals RP, RN, which have a constant cycle. The clock signals RP, RN are provided such that the activation time of a p-channel transistor and the activation time of an n-channel transistor of the second charge pump circuit 15 do not overlap each other and are equal to each other. For example, the duty ratio of the clock signal RP may be set at ¾, and the duty ratio of the clock signal RN may be set at ¼. Further, the rising of the clock signal RN is shifted by one half of a cycle from the falling of the clock signal RP.

The second LPF 16 removes alternating current components from the second charge pump output signal RD and provides the A/D converter 17 with a voltage Vr by fluctuating an initial voltage Vr0 in accordance with the pulse width of the second charge pump output signal RD. The voltage Vr is maintained at a constant value if the amount of current flowing during charging is substantially the same as the amount of current flowing during discharging in the second charge pump circuit 15. That is, the second charge pump circuit 15 is set such that the charging time and the discharging time are substantially equalized by the clock signals RP, RN. Accordingly, the voltage Vr is maintained at the initial voltage VrO when the charging current and the discharging current of the second LPF 16 are substantially equal to each other. The initial voltage VrO is set to coincide with the control voltage Vc generated by the first LPF 13.

The A/D converter 17 digitizes the voltage Vr provided by the second LPF 17 and generates control information SC. The bias circuit 18 receives the control information SC from the A/D converter 17 and generates first and second control voltages Vcp, Vcn in accordance with the control information SC. The charging currents and the discharging currents in the first and second charge pump circuits 12, 15 are controlled by the first and second control voltages Vcp, Vcn. That is, the charging currents and the discharging currents of the first and second charge pump circuits 12, 15 are substantially equalized by setting the voltage Vr output from the second LPF 16 at a predetermined value.

The output voltage Vr of the second LPF 16 fluctuates when the charging currents and the discharging currents become imbalanced in the first and second charge pump circuits 12, 15. Fluctuation of the output voltage Vr alters the control information SC. The bias circuit 18 provides the first and second control voltages Vcp, Vcn to the charge pump circuits 12, 15 in accordance with the altered output voltage Vr so that the charging current and the discharging current are substantially the same. This balances the charging current and the discharging current in each of the charge pump circuits 12, 15.

Figure 8:
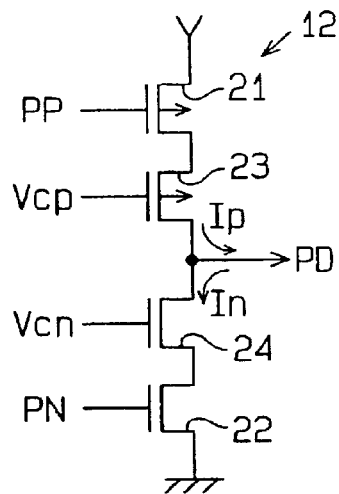
FIG. 8 is a circuit diagram showing a charge pump circuit of the phase-locked loop of FIG. 7.

FIG. 8 is a circuit diagram showing the first charge pump circuit 12. The second charge pump circuit 15 is preferably identical to the first charge pump circuit 12 and will thus not be described.

The first charge pump circuit 12 includes a drive p-channel MOS transistor 21, a drive n-channel MOS transistor 22, a current control p-channel MOS transistor 23, and a current control n-channel MOS transistor 24. The drive transistor 21 and the drive transistor 22 are connected in series between a high potential power supply and the ground. The current control transistors 23, 24 are connected in series between the transistors 21, 22. The first charge pump output signal PD is output from a node located between the transistors 23, 24. The comparison output signals PP, PN from the phase comparator 11 are applied to the gates of the drive transistors 21, 22, respectively. The first and second control voltages Vcp, Vcn provided by the bias circuit 18 are applied to the gates of the current control transistors 23, 24. When the drive transistor 21 is activated in response to the comparison output signal PP, the charging current Ip flows into the drive transistor 21 from the high potential power supply and charges a capacitor of the first LPF 13. When the drive transistor 22 is activated in response to the comparison output signal PN, the discharging current In flows from the drive transistor 22 to the ground, and thus discharges the capacitor of the first LPF 13. The current control transistor 23 connected between the drive transistor 21 and the output terminal responds to the first control voltage Vcp to control the charging current. In the same manner, the current control transistor 24 connected between the drive transistor 22 and the output terminal responds to the second control voltage Vcn to control the discharging current.

Figure 9:
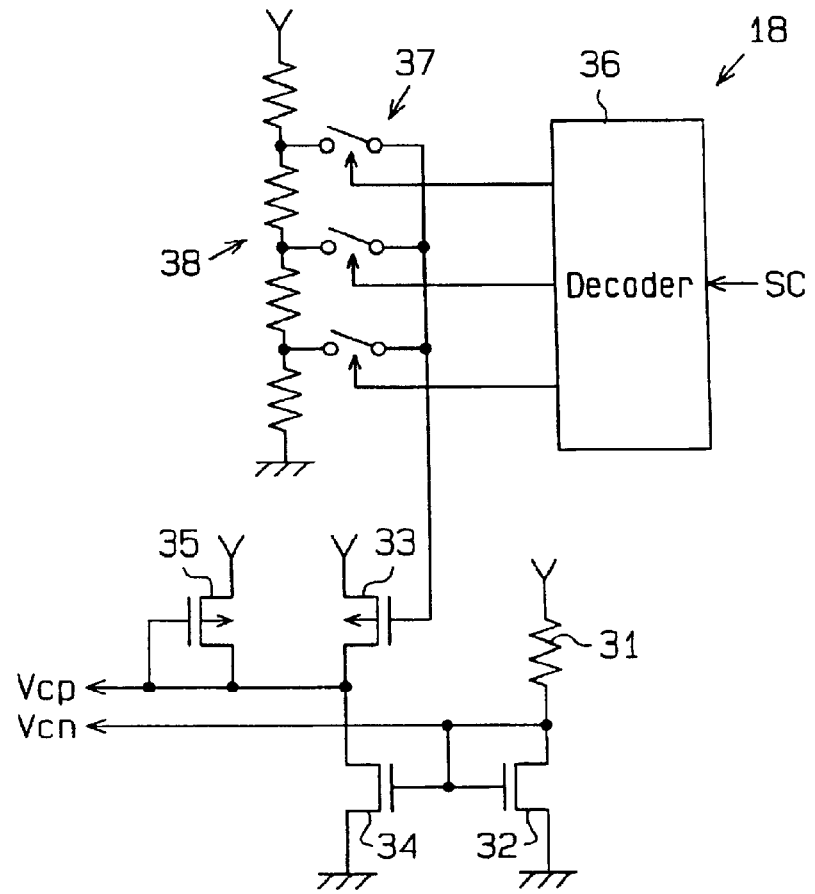
FIG. 9 is a schematic diagram showing a bias circuit of the phase-locked loop of FIG. 7.

FIG. 9 is a diagram showing the bias circuit 18. The bias circuit 18 includes a resistor 31, four transistors 32–35, a decoder 36, a switch group 37, and a resistor string 38. The p-channel transistor 33 and the n-channel transistor 34 are connected in series between a high potential power supply and the ground. A voltage provided from the switch group 37 is applied to the gate of the transistor 33. The gate of the transistor 34 and the gate of the transistor 32 are connected to a node located between the resistor 31 and the transistor 32. The current compensation p-channel transistor 35 is connected in parallel to the transistor 33. The first control voltage Vcp is output from the node between the transistors 33, 34. The resistor 31 and the n-channel transistor 32 are connected in series between the high potential power supply and the ground. The second control voltage Vcn is output from the node between the resistor 31 and the n-channel transistor 32.

The resistor string 38 is connected between the high potential power supply and the ground. A divisional voltage produced by dividing the voltage between the high potential power supply and the ground is output from the nodes located between each pair of adjacent resistors in the resistor string 38. Each of the switches in the switch group 37 is connected to an associated one of the nodes between the resistors. The decoder 36 closes one of the switches in the switch group 37 and selects the associated one of the divisional voltages in accordance with the control information SC. The selected divisional voltage is applied to the gate of the transistor 33.

When the decoder 36 changes the voltage at the gate of the transistor 33, the first control voltage Vcp fluctuates accordingly. Since the second control voltage Vcn is controlled, the fluctuation of the first control voltage Vcp causes the current Ip flowing through the transistors 21, 23 to vary in accordance with the current In flowing through the transistors 22, 24. As a result, the charging current and discharging current flowing through each transistor 22, 24 become substantially equal to each other and this stabilizes operation of the phase-locked loop 110.

As described above, in the first embodiment, feedback control is performed to substantially equalize the charging current and the discharging current in the second charge pump circuit 15. Further, the feedback information SC is sent to the first charge pump circuit 12. Since the first charge pump circuit 12 and the second charge pump circuit 15 are set to have the same operational characteristics, the charging current and the discharging current are also substantially the same in the first charge pump circuit 12.

Second Embodiment

Figure 10:
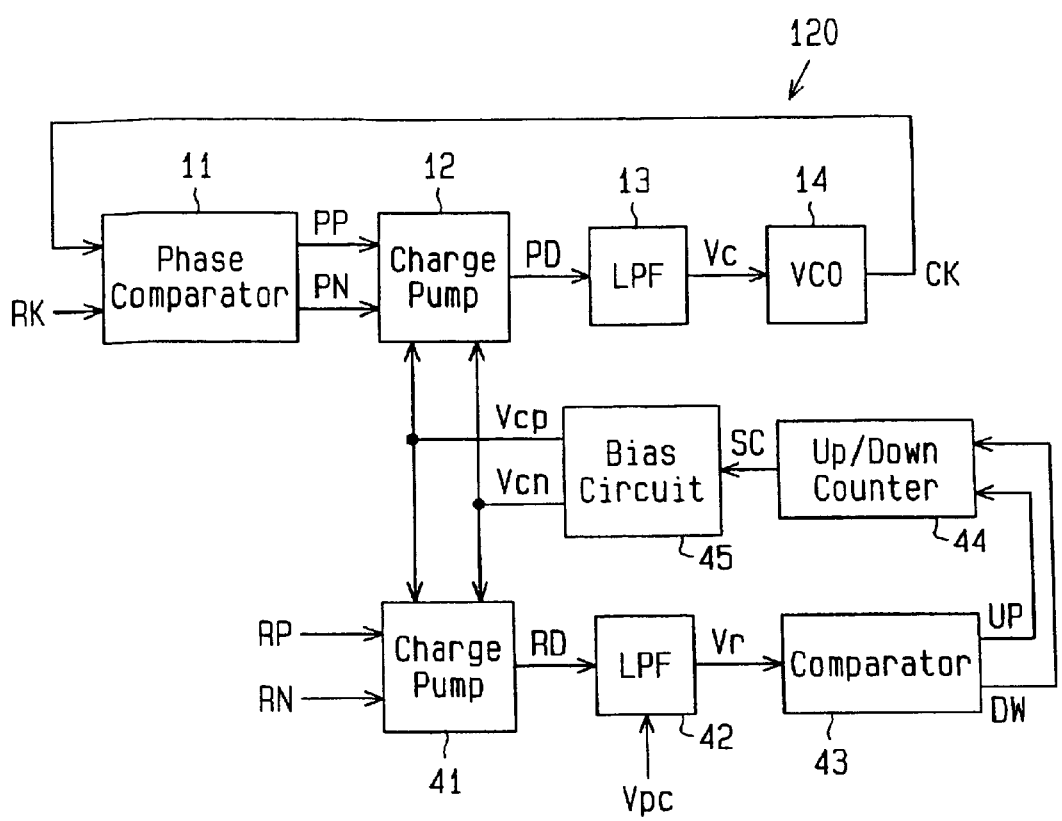
FIG. 10 is a schematic block diagram showing a phase-locked loop according to a second embodiment of the present invention.

FIG. 10 is a schematic block diagram showing a phase-locked loop 120 according to a second embodiment of the present invention. The phase-locked loop 120 includes a phase comparator 11, a first charge pump circuit 12, a second charge pump circuit 41, a first LPF 13, a second LPF 42, a VCO 14, a voltage comparator 43, an up and down counter 44, and a bias circuit 45.

The second charge pump circuit 41 generates a second charge pump output signal RD in response to clock signals RP, PN, which have a constant cycle. The second LPF 42 generates a voltage Vr corresponding to the pulse width of the second charge pump output signal RD.

The voltage comparator 43 compares the output voltage Vr from the second LPF 42 with a predetermined reference voltage. When the output voltage Vr is greater than the reference voltage, the voltage comparator 43 causes a count up signal UP to go high. When the output voltage Vr is lower than the reference voltage, the voltage comparator 43 causes a count down signal DW to go high. An upper limit reference voltage and a lower limit reference voltage may be set so that neither the count up signal UP nor the count down signal DW go high when the output voltage Vr is between the upper and lower limit reference voltages.

The up and down counter 44 performs a count up operation in response to the count up signal UP from the voltage comparator 43 and a count down operation in response to the count down signal DW. The up and down counter 44 then sends the count value to the bias circuit 45 as control information SC. The control information SC increases and decreases in accordance with the output voltage Vr and is substantially the same as the control information SC generated by the A/D converter 17 of the first embodiment. The bias circuit 45 generates the first and second control voltages Vcp, Vcn in accordance with the control information SC from the up and down counter 44 to control the charging current and the discharging current in each of the first and second charge pump circuits 12, 41.

In the second embodiment, the voltage comparator 43 and the up and down counter 44 are used to generate the control information SC and control the first and second charge pump circuits 12, 41 so that the output voltage Vr of the second LPF 42 is maintained at a predetermined value.

Third Embodiment

Figure 11:
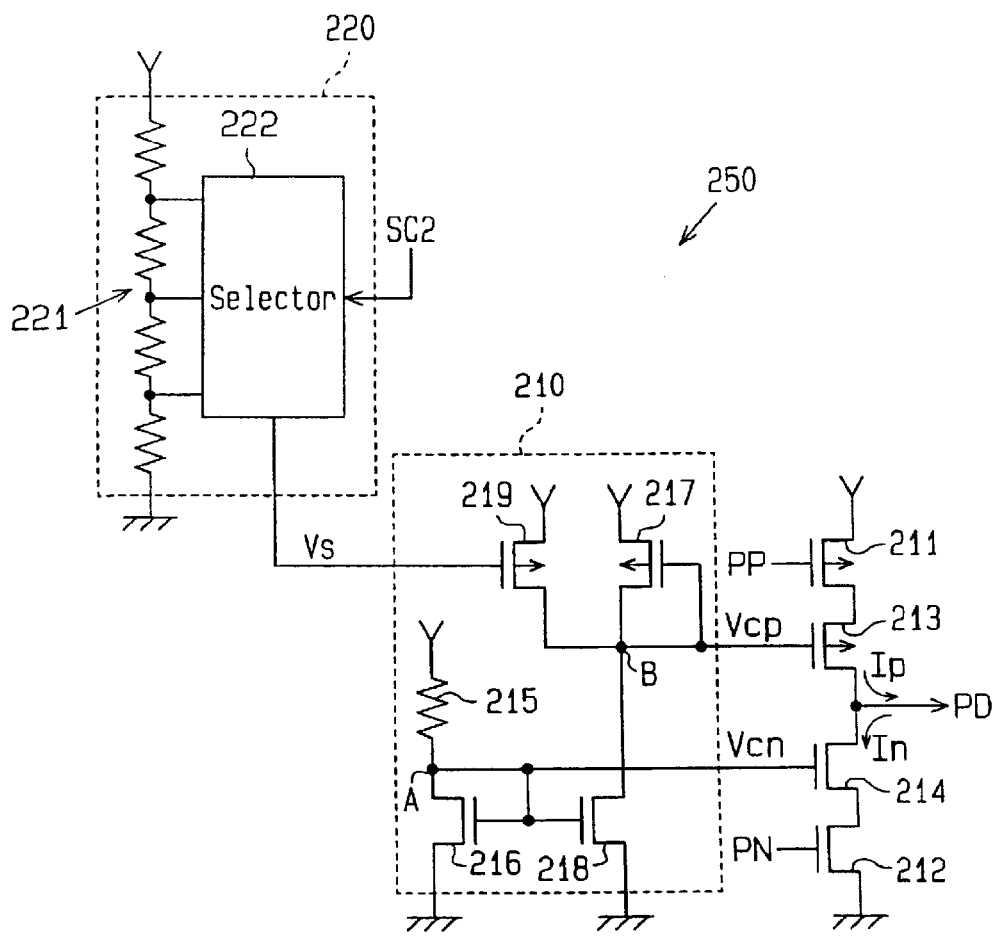
FIG. 11 is a circuit diagram showing a charge pump circuit according to a third embodiment of the present invention.
Figure 12:
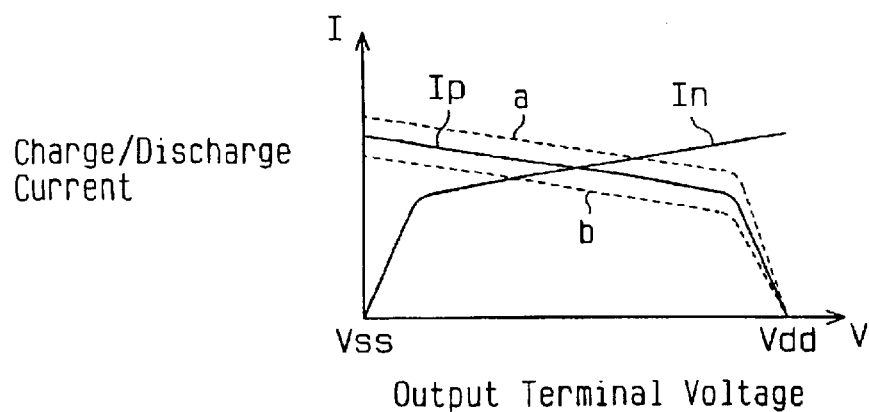
FIG. 12 is a graph showing the relationship between the voltage at an output terminal and the charge and discharge currents in the charge pump circuit of FIG. 11.

FIG. 11 is a circuit diagram showing a charge pump circuit 250 according to a third embodiment of the present invention. FIG. 12 is a graph showing the relationship between the voltage at the output terminal of the charge pump circuit 250 and the discharging current. The charge pump circuit 250 of the third embodiment may be incorporated in the PLL 110 of FIG. 7 and the PLL 120 of FIG. 10.

A drive p-channel MOS transistor 211 and a drive n-channel MOS transistor 212 are connected in series between the high potential power supply and the ground, respectively. A current control p-channel MOS transistor 213 and a current control n-channel MOS transistor 214 are connected in series between the drive transistors 211, 212. A charge pump output signal PD is output from a node between the transistors 213, 214. A first comparison output signal PP is applied to the gate of the drive transistor 211, and a second comparison output signal PN is applied to the gate of the drive transistor 212. A first control voltage Vcp and a second control voltage Vcn are generated by a bias circuit 210. The first control voltage Vcp is applied to the gate of the current control transistor 213, and the second control voltage Vcn is applied to the gate of the current control transistor 214.

Activation of the drive transistors 211, 212 in response to the associated first and second comparison output signals PP, PN causes the charging current Ip to flow and charge the load capacitor (not shown) connected to the output terminal and the discharging current In to flow and discharge the load capacitor. The ON resistance values of the current control transistors 213, 214 change in accordance with the associated control voltages Vcp, Vcn. This restricts the current Ip flowing toward the output terminal via the transistor 211 and the current Ip flowing out of the output terminal via the transistor 212.

The sources of the drive transistors 211, 212 are connected directly to the sources of the high potential power supply and the ground in response to the first and second comparison output signals PP, PN, respectively. Thus, the voltage difference between the gate and source of each transistor 211, 212 is ensured without being affected by the current restriction of the transistors 213, 214. That is, the voltage difference between the voltage of the first comparison output signal PP and the voltage of the high potential power supply becomes the voltage difference between the gate and source of the transistor 211. The voltage difference between the voltage of the second comparison output signal PN and the voltage of the ground becomes the voltage difference between the gate and source of the transistor 212. Thus, the transistors 211, 212 operate following the first and second comparison output signals PP, PN even if the cycles of the first and second comparison signals PP, PN are decreased. That is, a delay in the response of the transistor 211 or 212 to a comparison output signal having a relatively short cycle is prevented. Thus, the charge pump circuit 250 operates at high speeds.

The charge pump circuit 250 includes the bias circuit 210 and a voltage selection circuit 220. The bias circuit 210 has a resistor 215 and transistors 216–219. The resistor 215 and the n-channel MOS transistor 216 are connected in series between the high potential power supply and the ground. A node A located between the resistor 215 and the transistor 216 is connected to the gate of the transistor 216. The p-channel MOS transistor 217 and the n-channel MOS transistor 218 are connected in series between the high potential power supply and the ground. A node B located between the transistors 217, 218 is connected to the gate of the transistor 217. The gate of the transistor 218 is connected to the node A. The p-channel MOS transistor 219 is connected in parallel to the transistor 217 between the high potential power supply and the node B. The voltage selection circuit 220 provides an output voltage Vs to the gate of the transistor 219. The bias circuit 210 provides the second control voltage Vcn to the gate of the n-channel transistor 214 from the node A, and provides the first control voltage Vcp to the gate of the p-channel transistor 213 from the node B.

The voltage selection circuit 220 includes a resistor string 221 and a selector 222 and selects the output voltage Vs in accordance with control information SC2. The resistor string 221 provides a differential voltage between the high potential power supply voltage and the ground voltage and produces a plurality of divisional voltages (in this embodiment, three). The selector 222 receives the divisional voltages from the resistor string 221, selects one of the divisional voltages, and provides the selected divisional voltage as the output voltage Vs. Thus, the voltage Vs selected in accordance with the control information SC2 is applied to the gate of the transistor 219.

The currents Ip, In flowing through the transistors 213, 214 fluctuate in accordance with the voltage at the output terminal even if a constant voltage is applied to the gates of the transistors 213, 214. However, the current mirror operation of the bias circuit 210 maintains the currents Ip, In at a relatively constant value. In addition, the voltage at the node B (i.e., the first control voltage Vcp) varies in accordance with the selected voltage Vs. Thus, the operational characteristics of the p-channel transistor 213 also change. For example, when the selected voltage Vs is relatively high, the transistor 219 is likely to be deactivated and the voltage at the node B becomes relatively low. As a result, the first control voltage Vcp becomes relatively low and the transistor 213 will be activated. Accordingly, the current capacitance of the transistor 213 increases, and the current Ip flowing toward the output terminal via the transistor 213 increases. In this case, as shown by broken line a in FIG. 12, the characteristic of the current Ip relative to the output terminal voltage shifts upward. On the other hand, when the output voltage Vs is relatively low, the transistor 219 is likely to be activated and the voltage at the node B becomes relatively high. As a result, the first control voltage Vcp becomes relatively high and the transistor 213 is deactivated. Accordingly, the current capacitance of the transistor 213 decreases, and the current Ip flowing toward the output terminal via the transistor 213 decreases. In this case, as shown by broken line b in the graph of FIG. 12, the characteristic of the current Ip relative to the output terminal voltage shifts downward.

As described above, the difference between the current characteristics of p-channel and n-channel transistors is compensated for by changing the operational characteristics of the p-channel transistor 213. Thus, the operational range of the charge pump circuit 250 can be adjusted. Accordingly, the current Ip flowing through the p-channel transistors 211, 213 and the current In flowing through the n-channel transistors 212, 214 are substantially equal to each other.

Further, subsequent to integration, the voltage selection circuit 220 changes the transistor current characteristics and compensates for offset current characteristics that are caused by manufacturing differences.

Fourth Embodiment

Figure 13:
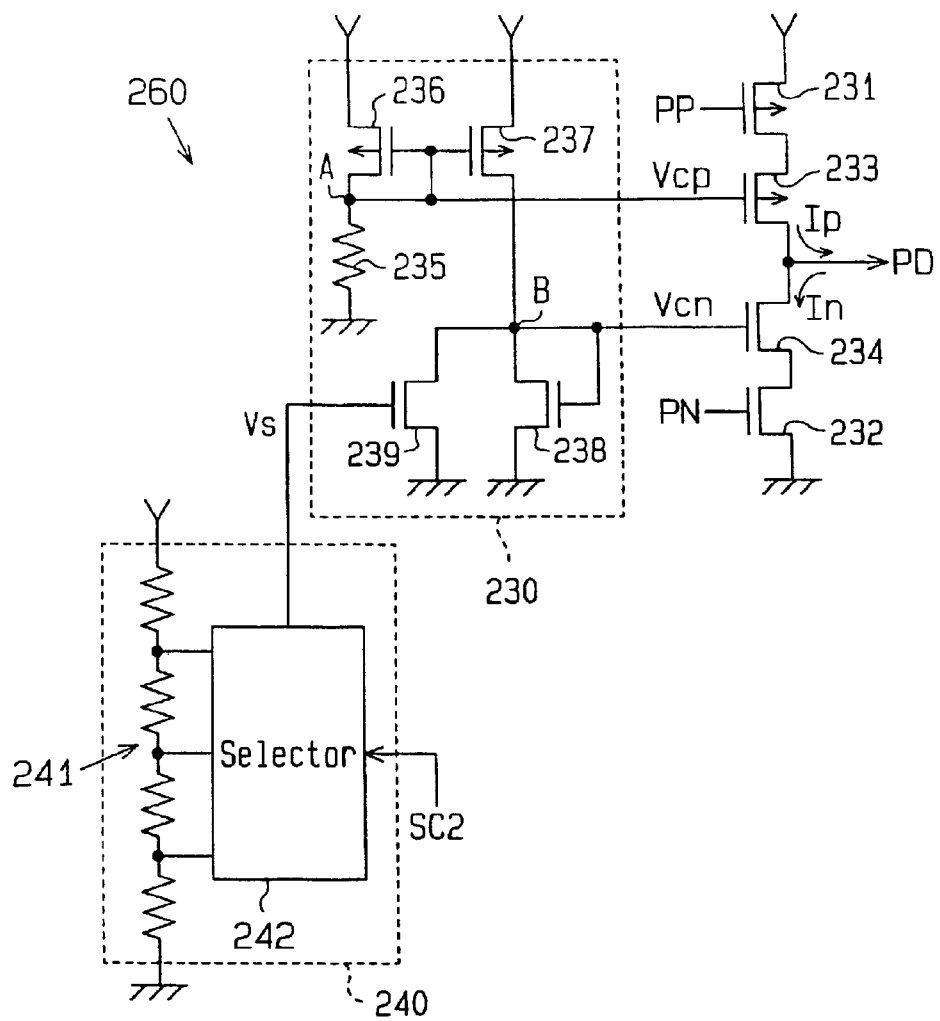
FIG. 13 is a circuit diagram showing a charge pump circuit according to a fourth embodiment of the present invention.
Figure 14:
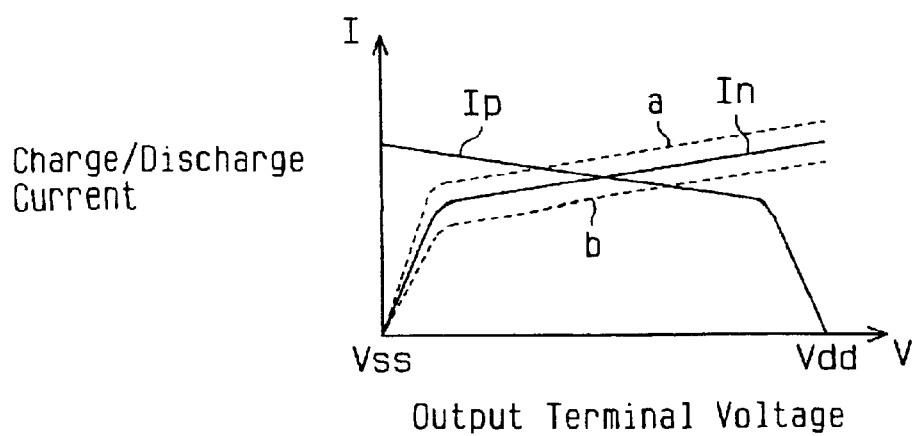
FIG. 14 is a graph showing the relationship between the voltage at an output terminal and the charge and discharge currents in the charge pump circuit of FIG. 13.

FIG. 13 is a circuit diagram showing a charge pump circuit 260 according to a fourth embodiment of the present invention. FIG. 14 is a graph showing the relationship between the output terminal voltage of the charge pump circuit 260 and the discharging current.

A p-channel MOS transistor 231 and an n-channel MOS transistor 232 are connected in series between the high potential power supply and the ground, respectively. A p-channel MOS transistor 233 and an n-channel MOS transistor 234 are connected in series between the transistors 231, 232. The transistors 231–234 are identical to the transistors 211–214 of FIG. 11. A first comparison output signal PP is applied to the gate of the transistor 231, and a second comparison output signal PN is applied to the gate of the transistor 232. A first control voltage Vcp is applied to the gate of the transistor 233, and the second control voltage Vcn is applied to the gate of the transistor 234. A charge pump output signal PD is output from a node between the transistors 233, 234.

A bias circuit 230 includes a resistor 235 and four transistors 236–239. The p-channel MOS transistor 236 and the resistor 235 are connected in series between the high potential power supply and the ground. A node A located between the p-channel MOS transistor 236 and the resistor 235 is connected to the gate of the transistor 236. The p-channel MOS transistor 237 and the n-channel MOS transistor 238 are connected in series between the high potential power supply and the ground. A node B located between the transistors 237, 238 is connected to the gate of the transistor 238. The gate of the transistor 237 is connected to the node A. The n-channel MOS transistor 239 is connected in parallel to the transistor 238 between the node B and the ground. An output voltage Vs selected by a voltage selector 240 is applied to the gate of the transistor 239. The second control voltage Vcn is provided to the n-channel transistor 234 from the node B. The first control voltage Vcp is provided to the p-channel transistor 233 from the node A.

The voltage selector 240 includes a resistor string 241 and a voltage selector 242 and selects a differential voltage as the output voltage Vs in accordance with control information SC2. The resistor string 241 generates a plurality of divisional voltages, one of which is selected by the voltage selector 242. The voltage Vs selected in accordance with the control information SC is applied to the gate of the transistor 239.

The current mirror operation of the bias circuit 230 maintains the currents Ip, In flowing through the respective transistors 231, 232 at a constant value. The voltage at the node B (i.e., the second control voltage Vcn) fluctuates in accordance with the selected output voltage Vs applied to the gate of the transistor 239. Thus, the operational characteristics of the n-channel transistor 234 can be changed. For example, when the selection voltage Vs is relatively high, the transistor 239 is activated and the voltage at the node B becomes relatively low. As a result, the second control voltage Vcn becomes relatively low and the transistor 234 is deactivated. Accordingly, the current In flowing in through the output terminal decreases. In this case, as shown by broken line b in the graph of FIG. 14, the characteristic of the current In relative to the output terminal voltage shifts downward. On the other hand, when the output voltage Vs is relatively low, the transistor 239 is deactivated and the voltage at the node B becomes relatively high. As a result, the second control voltage Vcn becomes relatively high and the transistor 234 is activated. Accordingly, the current In flowing in through the output terminal increases. In this case, as shown by broken line a in FIG. 14, the characteristic of the current In relative to the output terminal voltage shifts upward. The adjustment of the operational characteristic of the n-channel transistor 234 compensates for the difference between the current characteristics of p-channel and n-channel transistors and changes the operational range of the charge pump circuit 250.

Fifth Embodiment

Figure 15:
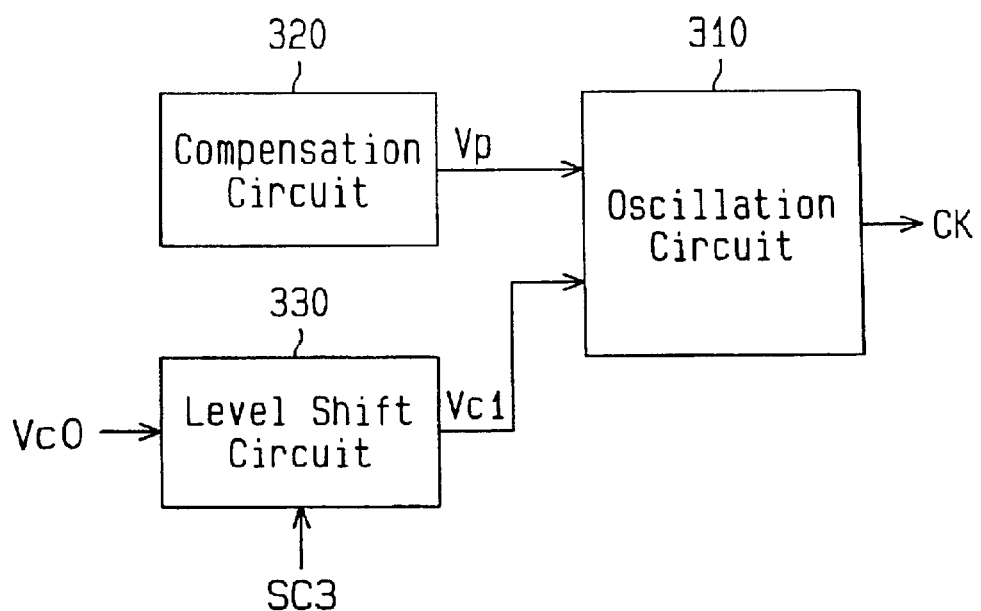
FIG. 15 is a schematic block diagram showing a voltage-controlled oscillator according to a fifth embodiment of the present invention.
Figure 16:
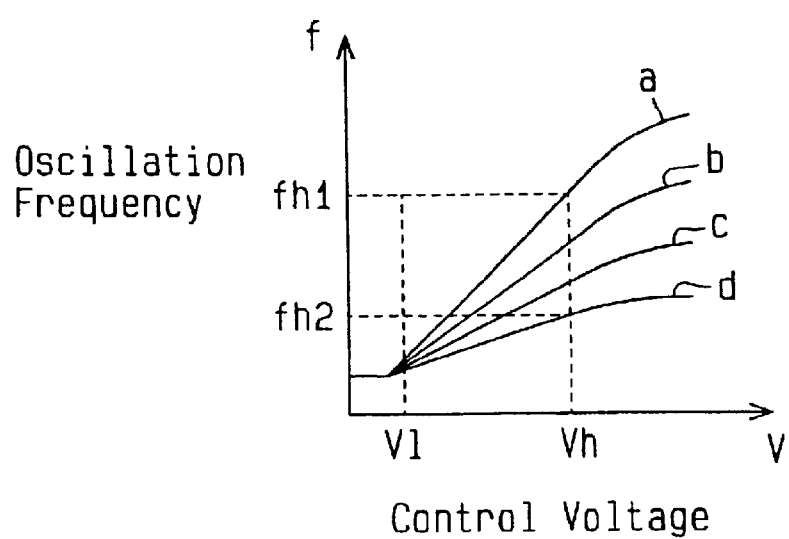
FIG. 16 is a graph showing the relationship between a control voltage and an oscillation frequency in the voltage-controlled oscillator of FIG. 15.

FIG. 15 is a schematic block diagram showing a VCO 350 according to a fifth embodiment of the present invention. FIG. 16 is a graph showing the relationship between the control voltage of the VCO 350 and the oscillation frequency.

The VCO 350 includes an oscillation circuit 310, a compensation circuit 320, and a level shift circuit 330. The oscillation circuit 310 is preferably a ring oscillator and sets the frequency of the oscillation clock signal CK in accordance with a first control voltage Vc1 and a second control voltage Vp. That is, the oscillation circuit 310 determines the frequency of the oscillation clock signal CK in accordance with the control voltage Vc1 provided by the level shift circuit 330. Further, the oscillation circuit 310 eliminates fluctuations of the oscillation clock signal CK, caused by temperature and voltage changes, in accordance with the second control voltage Vp provided by the compensation circuit 320.

The compensation circuit 320 includes a current mirror circuit formed by transistors, which saturation current changes in accordance with changes in the ambient temperature, and provides the second control voltage Vp to the oscillation circuit 310.

The level shift circuit 330 preferably includes a register for storing control information SC3. The level shift circuit 330 is provided with an initial control voltage Vc0 and shifts the level of the initial control voltage Vc0 while maintaining the linearity of the voltage Vc0. The level-shifted control voltage Vc0 is provided to the oscillation circuit 310 as the first control voltage Vc1. The initial control voltage Vc0 controls the frequency of the oscillation clock signal CK.

Figure 6:
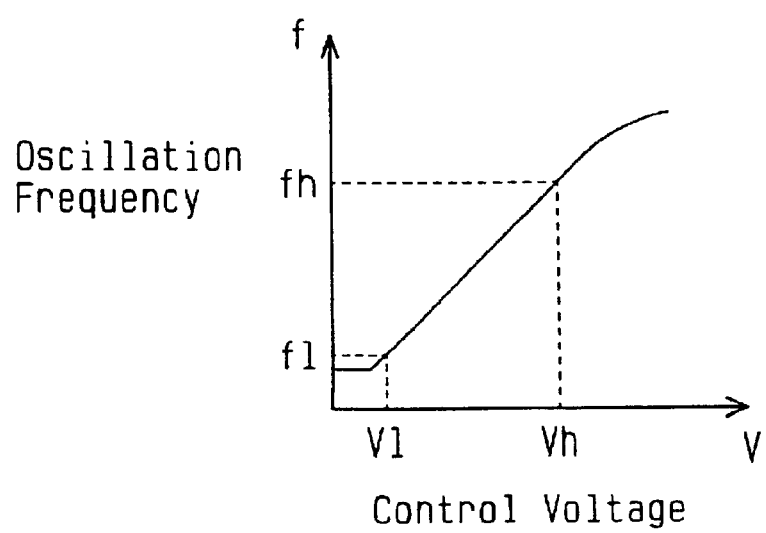
FIG. 6 is a graph showing the relationship between a control voltage and an oscillation frequency in the voltage-controlled oscillator of FIG. 5.

For example, as shown by curves a–d in FIG. 16, when the control information SC3 is two bit, the oscillation clock signal CK can be shifted between four levels. If the control voltage shift amount of the level shift circuit 330 is null, the oscillation characteristic, shown by curve a, is similar to that of the prior art example of FIG. 6. By changing the shift amount of the level shift circuit 330 to shift the first control voltage Vc1 between three levels, the oscillation characteristic also shifts between three levels as shown by the curves b–d. This varies the maximum value of the oscillation clock signal CK (when Vc=Vh) between fh1 and fh2. That is, the frequency band of the oscillation clock signal CK is adjusted in accordance with the control information SC3 stored in the level shift circuit 330. The control information SC3 can easily be changed even after integration of the VCO 350. Accordingly, if the oscillation clock signal frequency band is not included in the desirable range due to manufacturing differences, the frequency band can be easily corrected. Further, since the oscillation frequency band can be changed easily, the operational range of the VCO 350 is increased.

Figure 17:
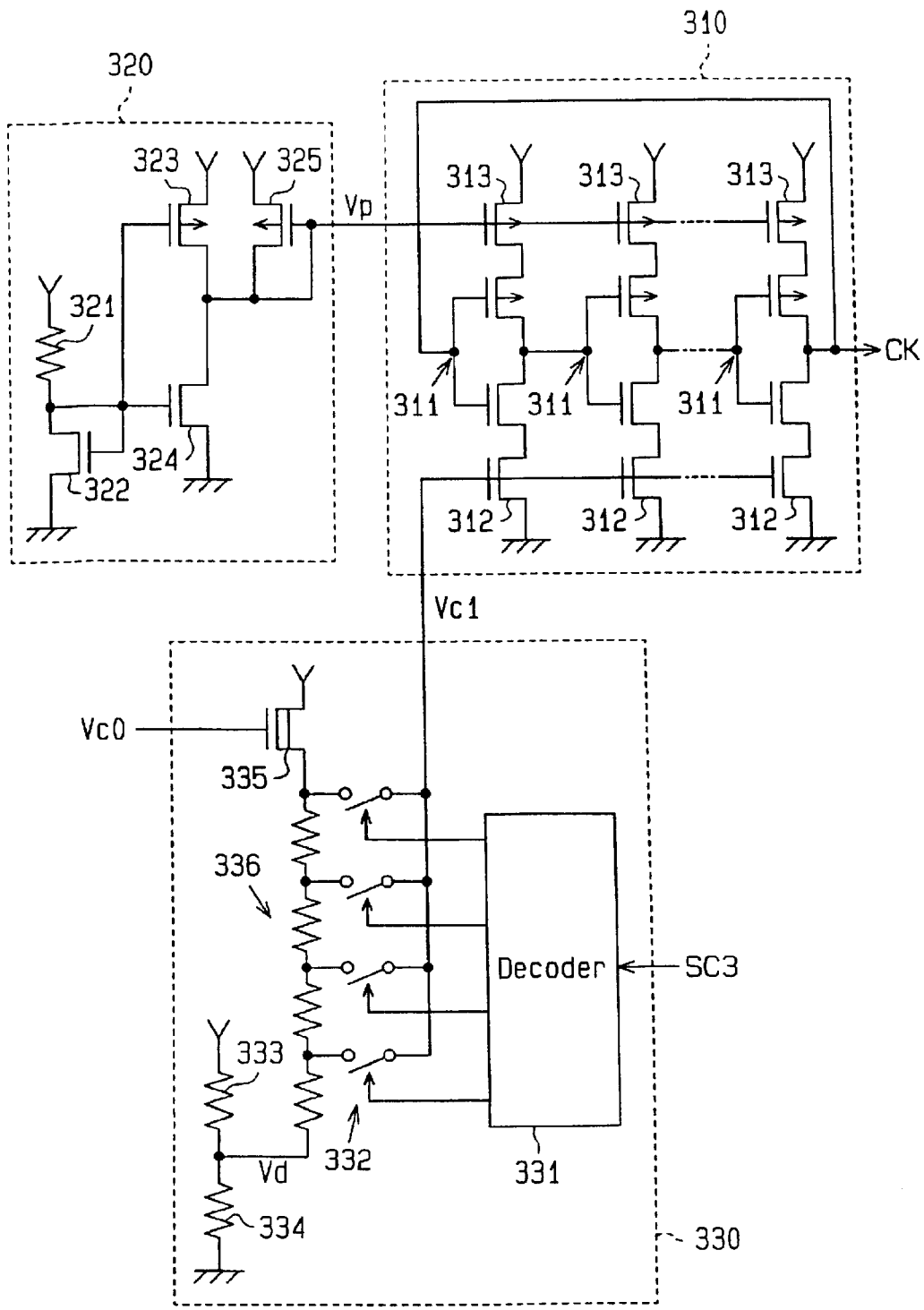
FIG. 17 is a circuit diagram showing the voltage-controlled oscillator of FIG. 15.

FIG. 17 is a circuit diagram showing the VCO 350 of FIG. 15.

The oscillation circuit 310 includes an odd number of CMOS inverters 311, a corresponding odd number of n-channel MOS transistors 312, one being connected between each inverter 311 and the ground, and a number of p-channel MOS transistors 313, one connected between each inverter 311 and the high potential power supply. The inverters 311 are connected in series and feedback the output of the final inverter to the input of the first inverter to form a ring oscillator. The first control voltage Vc1 from the level shift circuit 330 is applied to the gate of each transistor 312. Each transistor 312 controls the current that flows from the associated inverter 311 to the ground in response to the first control voltage Vc1. The second control voltage Vp from the compensation circuit 320 is applied to the gate of each transistor 313. Each transistor 313 controls the current that flows from the high potential power supply to the associated inverter 311 in response to the second control voltage Vp.

When the first control voltage Vc1 becomes relatively high, the resistance value of each transistor 312 becomes relatively low and the current that flows from each inverter 311 to the ground increases. This results in quicker response of the inverters 311 and increases the frequency of the oscillation clock signal CK. On the other hand, when the first control voltage Vc1 becomes relatively low, the resistance value of each transistor 312 becomes relatively high and the current that flows from each inverter 311 to the ground decreases. This results in slower response of the inverters 311 and decreases the frequency of the oscillation clock signal CK. The second control voltage Vp behaves in a manner opposite the first control voltage Vc1. When the control voltage Vp becomes relatively high, the frequency of the oscillation clock signal CK decreases, and when the control voltage Vp becomes relatively low, the frequency of the oscillation clock signal CK increases.

The compensation circuit 320 includes a resistor 321 and four transistors 322–325. The resistor 321 and an n-channel MOS transistor 322 are connected in series between the high potential power supply and the ground. A first node located between the resistor 321 and the transistor 322 is connected to the gate of the transistor 322. A p-channel MOS transistor 323 and an n-channel MOS transistor 324 are connected in series between the high potential power supply and the ground. The first node is connected to the gate of each transistor 323, 324. A p-channel MOS transistor 325 is connected in parallel to the transistor 323. The gate of the transistor 325 is connected to a second node located between the transistors 323, 324.

The transistors 324, 325 form a current mirror circuit relative to the resistor 321 and the transistor 322. The voltage at the second node changes in accordance with the current flowing through the resistor 321 and the transistor 322. The transistor 323 changes the current amount in accordance with the voltage at the first node and compensates for the current flowing through the transistor 325. The differential voltage between the second node voltage and the ground voltage is provided to the oscillation circuit 310 as the second voltage Vp. Accordingly, if the ambient temperature fluctuates and changes the resistance value of the transistors of the oscillation circuit 310, the second control voltage Vp is adjusted to compensate for the change. This suppresses fluctuation of the current-flowing through the inverters 311 and fluctuation of the frequency of the oscillation clock signal CK. That is, the gain of the oscillation circuit 310 is altered to suppress fluctuation of the oscillation frequency. This suppresses the operation of a PLL using a VCO 310 and enhances reliability.

The level shift circuit 330 includes a decoder 331, a switch group 332, resistors 333, 334, a depletion transistor 335, and a resistor string 336. The resistors 333, 334 are connected in series between the high potential power supply and the ground and generate a differential voltage Vd between the high potential power supply voltage and the ground voltage. The depletion transistor 335 and the resistor string 336 are connected in series between the node between the resistors 333 and the high potential power supply. A control voltage Vc0 is applied to the gate of the transistor 335. Accordingly, a source follower circuit is formed. A plurality of voltages is formed at the nodes between the resistors by shifting the control voltage Vc0 in a step-by-step manner. The decoder 331 stores control information SC3 and sends a selection signal to the switch group 332 in accordance with the control information SC3. Each of the switches in the switch group 332 is connected to an associated one of the nodes between the resistors of the resistor string 336. Each switch is operated in response to a selection command from the decoder 331, such that a certain voltage is selected. The differential voltage between the selected voltage and the ground voltage is provided to the oscillation circuit 310 as the first control voltage Vc1.

The decoder 331 preferably includes a non-volatile memory device for storing control information that can be set as desired. Accordingly, the shift amount of the first control voltage Vc1 relative to the control voltage Vc0 can be set by the control information.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A charge pump circuit comprising:

a p-channel drive transistor and an n-channel drive transistor connected in series between a high potential power supply and a low potential power supply, wherein input signals are respectively applied to a gate of the p-channel drive transistor and a gate of the n-channel drive transistor in order to generate a charge pump output signal at a node between the p-channel and n-channel drive transistors;

a p-channel current control transistor connected between the p-channel drive transistor and the node; and an n-channel current control transistor connected between the n-channel drive transistor and the node, wherein compensation voltages are respectively applied to a gate of the p-channel current control transistor and a gate of the n-channel current control transistor.

2. The charge pump circuit according to claim 1, wherein the compensation voltages are set in accordance with changes in characteristics of each of the transistors.

3. The charge pump circuit according to claim 1, wherein the compensation voltages are set in accordance with fluctuations in the voltage of the high potential power supply.

4. The charge pump circuit according to claim 1, further comprising:

a first transistor and a resistor connected in series between the high potential power supply and the low potential power supply; and a second transistor and a third transistor connected in series between the high potential power supply and the low potential power supply, wherein a gate of the first transistor and a gate of the second transistor are connected to a first node between the first transistor and the resistor, and a gate of the third transistor is connected to a second node between the second and third transistors, wherein the first compensation voltage is applied to one of the gates of the p-channel and n-channel current control transistors, and a second compensation voltage is applied to the other one of the gates of the p-channel and n-channel current control transistors.

5. The charge pump circuit according to claim 4, further comprising a fourth transistor connected in parallel to the third transistor, wherein a control voltage is applied to a gate of the fourth transistor in order to adjust the second compensation voltage.

6. A charge pump circuit comprising:
- a p-channel drive transistor and an n-channel drive transistor connected in series between a high potential power supply and a low potential power supply, wherein input signals are respectively applied to a gate of the p-channel drive transistor and a gate of the n-channel drive transistor in order to generate a charge pump output signal at a node between the p-channel and n-channel drive transistors;
- a p-channel current control transistor connected between the p-channel drive transistor and the node;
- an n-channel current control transistor connected between the n-channel drive transistor and the node;
- a first transistor and a resistor connected in series between the high potential power supply and the low potential power supply;
- a second transistor and a third transistor connected in series between the high potential power supply and the low potential power supply; and
- a fourth transistor connected in parallel to the third transistor, wherein a gate of the first transistor, a gate of the second transistor, and one of a gate of the p-channel current control transistor and a gate of the n-channel current control transistor are connected to a first node between the first transistor and the resistor, and a gate of the third transistor and the gate of the other one of the p-channel and n-channel current control transistors are connected to a second node between the second and third transistors, and wherein a control voltage is applied to a gate of the fourth transistor.

* * * * *